(12) United States Patent
Hirler

(10) Patent No.: US 8,860,132 B2
(45) Date of Patent: Oct. 14, 2014

(54) SEMICONDUCTOR DEVICE ARRANGEMENT COMPRISING A SEMICONDUCTOR DEVICE WITH A DRIFT REGION AND A DRIFT CONTROL REGION

(75) Inventor: Franz Hirler, Isen (DE)

(73) Assignee: Infineon Technologies Austria AG, Villach (AT)

(*) Notice: Subject to any disclaimer, the term of this patent is extended or adjusted under 35 U.S.C. 154(b) by 156 days.

(21) Appl. No.: 13/307,545

(22) Filed: Nov. 30, 2011

(65) Prior Publication Data

US 2013/0134509 A1    May 30, 2013

(51) Int. Cl.
   *H01L 29/66* (2006.01)
(52) U.S. Cl.
   USPC .................... 257/335; 257/341; 257/E29.197
(58) Field of Classification Search
   USPC ................... 257/335, 341, E29.197
   See application file for complete search history.

(56) References Cited

U.S. PATENT DOCUMENTS

2009/0218621 A1*  9/2009  Pfirsch et al. ............... 257/342
2010/0078710 A1*  4/2010  Willmeroth et al. ......... 257/329

FOREIGN PATENT DOCUMENTS

WO        2007/012490 A2      2/2007

* cited by examiner

*Primary Examiner* — Zandra Smith
*Assistant Examiner* — Jamie C Niesz
(74) *Attorney, Agent, or Firm* — Murphy, Bilak & Homiller, PLLC

(57) ABSTRACT

A semiconductor device includes a source region, a drain region, a body region, and a drift region. The drift region is arranged between the body and the drain and the body is arranged between the source and the drift region in a semiconductor body. A gate electrode is adjacent the body and dielectrically insulated from the body by a gate dielectric. A drift control region is adjacent the drift region and dielectrically insulated from the drift region by a drift control region dielectric. A drain electrode adjoins the drain. The device also includes an injection control region of the same doping type as the drain, but more lowly doped. The injection control region adjoins the drift control region dielectric, extends in a first direction along the drift control region, and adjoins the drain in the first direction and an injection region in a second direction different from the first direction.

22 Claims, 9 Drawing Sheets

SEMICONDUCTOR DEVICE ARRANGEMENT COMPRISING A SEMICONDUCTOR DEVICE WITH A DRIFT REGION AND A DRIFT CONTROL REGION

TECHNICAL FIELD

Embodiments of the present invention relate to a semiconductor device arrangement including a semiconductor device with a drift region and drift control region.

BACKGROUND

A relatively new type of a power semiconductor device includes a conventional MOSFET (metal oxide semiconductor field effect transistor) topology with a source region, a drain region, a body region, a drift region, a gate electrode and a gate dielectric, and further includes a drift control region and a drift control region dielectric between the drift region and the drift control region. The semiconductor device can be switched in an on-state or an off-state by applying a suitable drive potential to the gate electrode.

In operation of the semiconductor device the drift control region is connected to a biasing source that, when the semiconductor device is in an on-state, biases the drift control region such that a conducting channel is generated in the drift region along the drift control region dielectric. This conducting channel is an inversion channel or an accumulation channel, namely dependent on the doping type of the drift region, and helps to reduce the on-resistance of the semiconductor device.

In the off-state of the semiconductor device, a space charge region (depletion region) expands in the drift region and the drift control region. When the semiconductor device is switched from the off-state to the on-state, this depletion region has to be removed from the drift region.

There is a need to provide a semiconductor device with a drift region and a drift control region that is capable of switching fast from the off-state to the on-state and that has low losses during the transition from the off-state to the on-state.

SUMMARY

A first embodiment relates to a semiconductor device arrangement with a semiconductor device. The semiconductor device includes a source region, a drain region, a body region, and a drift region. The drift region is arranged between the body region and the drain region, and the body region is arranged between the source region and the drift region. A gate electrode is adjacent the body region and is dielectrically insulated from the body region by a gate dielectric, and a drift control region is adjacent the drift region and is dielectrically insulated from the drift region by a drift control region dielectric. The semiconductor device further includes an injection region of a doping type complementary to the doping type of the drain region, a drain electrode electrically contacting the drain region and the injection region, and an injection control region of the same doping type as the drain region but more lowly doped. The injection control region adjoins the drift control region, extends in a first direction along the drift control region, and adjoins the drain region in the first direction and the injection region in a direction perpendicular to the first direction.

A second embodiment relates to a semiconductor device arrangement including a semiconductor device. The semiconductor device includes a source region, a drain region, a body region, and a drift region, with the drift region being arranged between the body region and the drain region and the body region being arranged between the source region and the drift region in a semiconductor body, a gate electrode adjacent the body region and dielectrically insulated from the body region by a gate dielectric, a drift control region adjacent the drift region and dielectrically insulated from the drift region by a drift control region dielectric, an injection region of a doping type complementary to the doping type of the drain region, a drain electrode electrically contacting the drain region, and an injection control region of the same doping type as the drain region but more lowly doped. The injection control region adjoins the drift control region dielectric, extends in a first direction along the drift control region, and adjoins the drain region and the injection region in a first direction. The injection region is adjacent the drain region in a direction parallel to an interface between the drift control region dielectric and the drift region.

A third embodiment relates to a semiconductor device arrangement including a semiconductor device. The semiconductor device includes a source region, a drain region, a body region, and a drift region, with the drift region being arranged between the body region and the drain region and the body region being arranged between the source region and the drift region in a semiconductor body, a gate electrode adjacent the body region and dielectrically insulated from the body region by a gate dielectric, a drift control region adjacent the drift region and dielectrically insulated from the drift region by a drift control region dielectric, an injection region of a doping type complementary to the doping type of the drain region, a drain electrode electrically contacting the drain region, and an injection control region of the same doping type as the drain region but more lowly doped. The injection control region adjoins the drift control region dielectric, extends in a first direction along the drift control region, adjoins the drain region and the injection region and has a doping concentration different from the doping concentration of the drift region.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 11 that includes

FIG. 13 that includes

FIG. 14 that includes

FIG. 15 that includes

FIG. 16 that includes

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
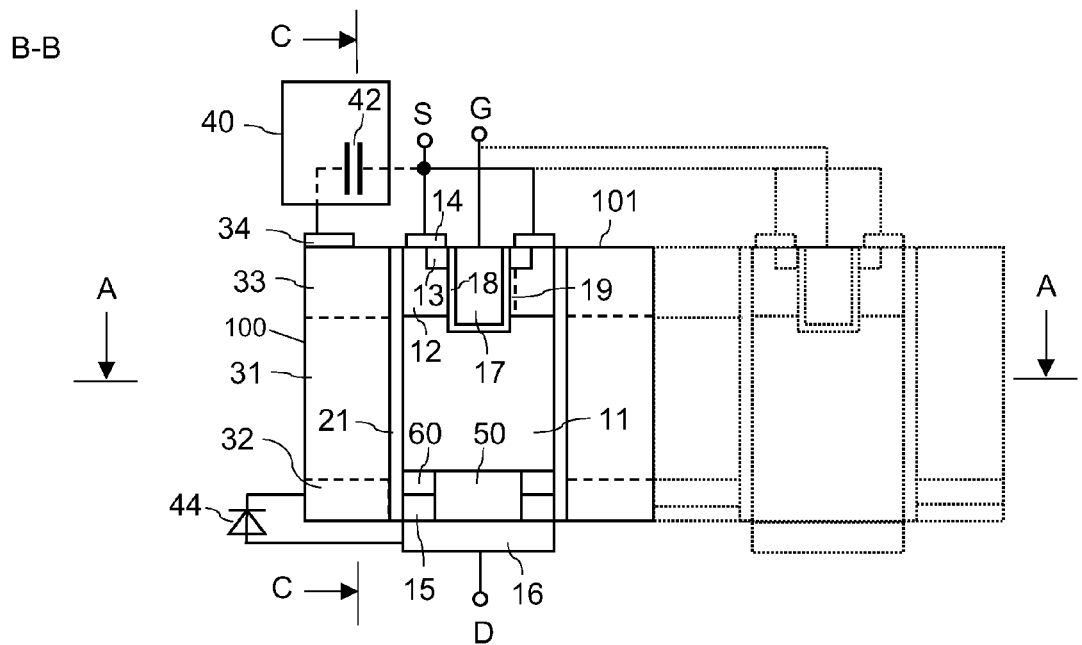
FIG. 1 illustrates a vertical cross sectional view of a semiconductor device including a trench gate electrode, a drift region, a drift control region, an injection region, and an injection control region, and illustrates a biasing source coupled to the drift control region.

FIG. 1 illustrates a semiconductor device arrangement according to a first embodiment. The semiconductor device arrangement includes a semiconductor device. The semiconductor device is implemented as a MOSFET, specifically as a vertical MOSFET in the embodiment of FIG. 1. Referring to FIG. 1, a vertical MOSFET is a MOSFET in which a current flow direction corresponds to a vertical direction of a semiconductor body 100 in which active device regions of the MOSFET are implemented. The "vertical direction" of the semiconductor body 100 is a direction perpendicular to a first surface 101 of the semiconductor body 100. FIG. 1 shows a vertical cross sectional view of the MOSFET, or, more precisely, a vertical cross sectional view of the semiconductor body 100. The basic operating principle explained in the following, however, is not restricted to vertical MOSFETs, but also applies to lateral MOSFETs in which a current flow direction corresponds to a lateral direction of a semiconductor body.

Referring to FIG. 1, the MOSFET includes a drift region 11, a body region 12, a source region 13, and a drain region 15. The source and drain regions 13, 15 are arranged distant in the current flow direction, which is the vertical direction of the semiconductor in the present embodiment. The body region 12 is arranged between the source region 13 and the drift region 12, and the drift region 11 is arranged between the body region 12 and the drain region 15. The drain region 15 is electrically connected to a drain electrode 16 that forms or that is connected to a drain terminal D (only schematically illustrated in FIG. 1). The source region 13 and the body region 12 are electrically connected to a source electrode 14 which forms or which is connected to a source terminal S.

The drift region 11, the body region 12, the source region 13, and the drain region 15 form active device regions of the MOSFET and are implemented in the semiconductor body 100. The active device regions are monocrystalline semiconductor regions according to one embodiment. The drain electrode 16 may include, e.g., a highly doped monocrystalline semiconductor substrate, a polycrystalline semiconductor material, a silicide or a metal. The source electrode 14 may include a polycrystalline semiconductor material, a silicide or a metal.

The MOSFET further includes a gate electrode 17 which extends from the source region 13 through the body region 12 to or into the drift region 11. The gate electrode 17 is dielectrically insulated from these semiconductor regions by a gate dielectric 18 and is connected to a gate terminal G. The gate dielectric 18 can be a conventional gate dielectric and includes, for example, an oxide, a nitride, or a high-k dielectric.

The MOSFET can be implemented as an n-type MOSFET or as a p-type MOSFET. In an n-type MOSFET, the source region 13 and the drain region 15 are n-doped, while the body region 12 is p-doped. In a p-type MOSFET, the source region 13 and the drain region 15 are p-doped while the body region 12 is n-doped. The doping concentration of the source region and the drain region 13, 15 is, for example in the range of between $5E17$ $cm^{-3}$ and $1E21$ $cm^{-3}$. The doping concentration of the body region 53 is, for example, in the range of between $5E16$ $cm^{-3}$ and $5E18$ $cm^{-3}$.

The MOSFET can be implemented as an enhancement (normally-off) MOSFET or as a depletion (normally-on) MOSFET. In an enhancement MOSFET, the body region 12 extends to the gate dielectric 18. In a depletion MOSFET, the body region 12 at least along the gate dielectric 18 includes a channel region 19 (illustrated in dashed lines along one side of the gate electrode 17 in FIG. 1) of the same doping type as the source region 13.

In the type of MOSFET illustrated in FIG. 1, the drift region 11 can have the same doping type as the source region 13 and the drain region 15, but could also be doped complementarily to the source region 13 and the drain region 15, wherein at least one section of the drift region 11 between a dielectric layer 21 which will be explained in the following and a channel region of the MOSFET may have the same doping type as the source region 13. The "channel region" of the MOSFET is a region of the body region 13 along the gate dielectric 18 where the gate electrode 17 controls a conducting channel. The doping concentration of the drift region 11 is, for example, in the range of between $1E12$ $cm^{-3}$ and $1E15$ $cm^{-3}$.

Referring to FIG. 1, the MOSFET further includes a drift control region 31 that is dielectrically insulated from the drift region 11 by a dielectric layer 21. The dielectric layer 21 will be referred to as drift control region dielectric 21 in the following. The drift control region dielectric 21 extends in the current flow direction. Thus, in the embodiment illustrated in FIG. 1, the drift control region dielectric 21 is a vertical dielectric layer extending in the vertical direction of the semiconductor body 100. A drift control region 31 is configured to generate a conducting channel in the drift region 11 along the drift control region dielectric 21 when the MOSFET is in an on-state. This conducting channel helps to reduce the on-resistance of the MOSFET. The MOSFET, like a conventional MOSFET, is in the on-state, when an electrical potential is applied to the gate terminal G that induces a conducting channel in the body region 12 between the source region 13 and the drift region 11 along the gate dielectric 18, and when an electrical voltage is applied between the drain and the source terminals D, S. For example, in an n-type enhancement MOSFET, the voltage to be applied between the gate terminal G and the source terminal S is a positive voltage and the voltage to be applied between the drain terminal D and the source terminal S is a positive voltage in order to cause the MOSFET to be in the on-state. The conducting channel along the gate control region dielectric 21 is an accumulation channel when the drift region 11 has the same doping type as the source and drain regions 13, 15, and the conducting channel is an inversion channel, when the drift region 11 is doped complementarily to these source and drain regions 13, 15.

The semiconductor device arrangement further includes a biasing source 40 coupled to the drift control region 31. The biasing source 40 is configured to bias the drift control region 31 such that a conducting channel is generated in the drift region 11 along the gate control region dielectric 21 when the MOSFET is in the on-state. In an arrangement with an n-type MOSFET, the biasing source 40 is configured to charge the drift control region 31 such that the drift control region 31 assumes an electrical potential higher than the electrical potential of the drift region 11, when the MOSFET is in an on-state. In this case, an electron channel (as an accumulation or inversion channel, dependent on the doping type of the drift region 11) is generated in the drift region 11 along the drift control region dielectric 21. In an arrangement with a p-type MOSFET, the biasing source 40 is configured to charge the drift control region 31 such that the drift control region 31 assumes an electrical potential lower than the electrical potential of the drift region 11. The biasing source 40 can be implemented in many different ways. Two possible examples are illustrated in FIGS. 2 and 3.

Figure 2:
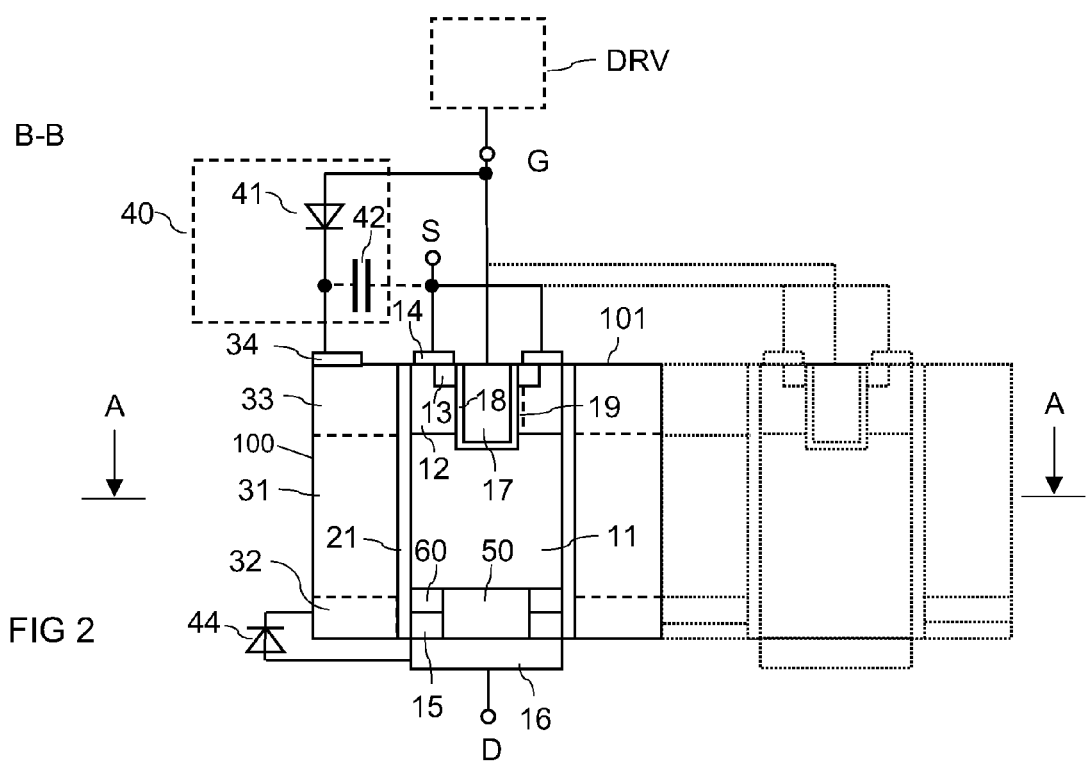
FIG. 2 illustrates a biasing source according to a first embodiment.

Referring to FIG. 2, the biasing source 40 can be connected to the gate terminal G and can include a rectifier element 41, such as a diode, connected between the gate terminal G and the drift control region 31. The polarity of the diode illustrated in FIG. 1 applies to an n-type MOSFET in which the gate terminal has an electrical potential higher than the source and body regions 13, 12 when the MOSFET is in the on-state. In this embodiment, the drift control region 31 is charged through a gate drive circuit DRV (illustrated in dashed lines in FIG. 2) each time, the electrical potential at the gate terminal is higher (in an n-type MOSFET) or lower (in a p-type MOSFET) than the electrical potential of the drift control region 31.

According to a further embodiment (not illustrated), the drift control region 31 is connected to the gate terminal G e.g. via an electrode 34 and an optional semiconductor region 33. In this embodiment, the gate drive circuit DRV connected to the gate terminal and configured to switch the MOSFET on and off by applying a suitable drive potential to the gate terminal G and the gate electrode 17, respectively, also acts as a biasing source that biases the drift control region 31 each time the MOSFET is switched on.

Figure 3:
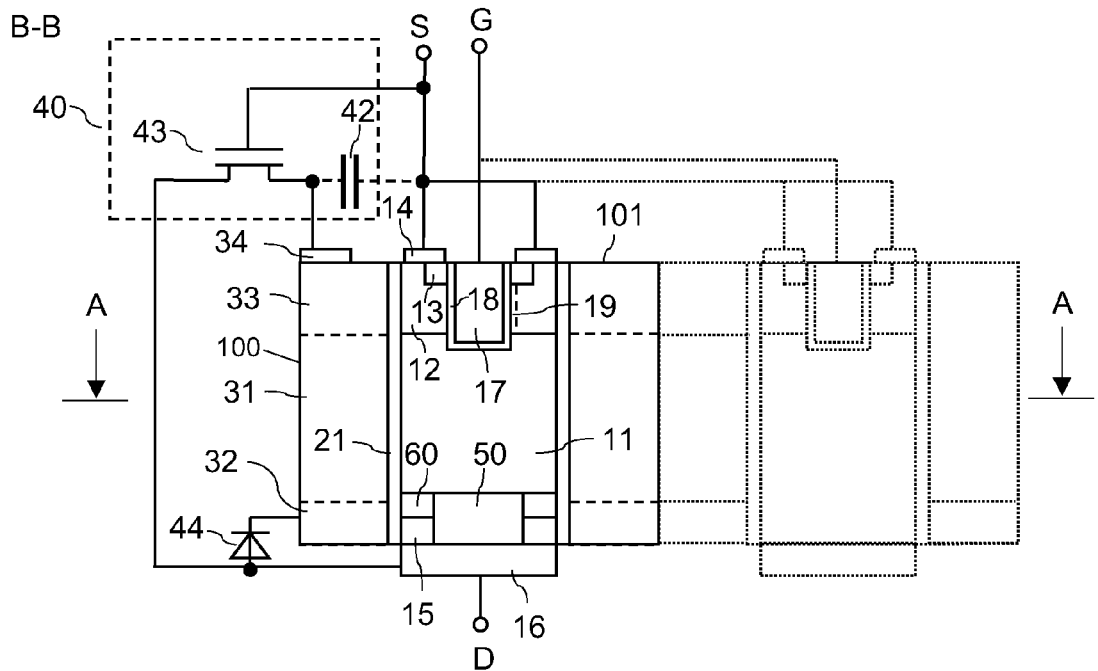
FIG. 3 illustrates a biasing source according to a second embodiment.

In the embodiment illustrated in FIG. 3, the biasing source includes a depletion transistor 43, such as a depletion MOSFET. The depletion transistor 43 includes a load path (drain-source path) connected between the drain terminal D and the drift control region 31 of the MOSFET, and a control terminal (gate terminal). The control terminal is connected to a terminal for a reference potential, such as, e.g., the source terminal S. In this biasing circuit 40, the depletion transistor 43 charges the drift control region 31 through the drain terminal D until a voltage between the drift control region 31 and the reference terminal (source terminal S in the embodiment of FIG. 3) corresponds to a pinch-off voltage of the depletion transistor 43.

Referring to FIGS. 1 to 3, the biasing circuit 40 may further include a capacitive element 42, such as a capacitor, coupled between the drift control region 31 and a terminal for a reference potential, such as the source terminal S. The capacitive element 42 serves to store charge carriers from the drift control region 31 when the MOSFET is in the off-state. These charge carriers are needed in the drift control region 31 for controlling (generating) the conducting channel in the drift region 11 along the drift control region dielectric 21 when the MOSFET is in the on-state. This is explained in further detail below. Storing charges in the capacitor 42 during off-periods of the MOSFET and providing these charges from the capacitor 42 when the MOSFET is switched on helps to reduce switching losses, which is, in particular, an issue at high switching frequencies.

Further, the semiconductor device arrangement may include a rectifier element 44, such as a diode, connected between the drain region 15 and a drain-sided end of the drift control region 31. The drift control region 31 extends along the drift region 11 in a current flow direction of the MOSFET. The "drain-sided end" of the drift control region 31 is the end that is located towards the drain region 15 (or drain electrode 16) of the MOSFET. Consequently, a "source-sided end" of the drift control region 31 is the end that is located towards the source region 13 (or source electrode 14) of the MOSFET. Optionally, the rectifier element 44 is connected to a connection region 32 which has the same doping type as the source and drain regions 13, 15, so that the connection region 32 is n-doped in an n-type MOSFET and p-doped in a p-type MOSFET. The connection region 32 has a higher doping concentration than the drift control region 31. The doping concentration of the connection region 32 is, for example, in the range of between $10E18$ cm$^{-3}$ and $10E21$ cm$^{-3}$.

The MOSFET may further include a semiconductor region 33 doped complementarily to the source and drain regions 13, 15 of the MOSFET and adjoining the drift control region 31 at a source-sided end of the drift control region 31. In an n-type MOSFET the semiconductor zone 33 is p-doped, and in a p-type MOSFET the semiconductor zone 33 is n-doped. The biasing source 40 is connected to the drift control region 31 via this optional semiconductor region 33. Referring to FIGS. 1 to 3, the biasing source 40 can be connected to a contact electrode 34, with the contact electrode being connected to the drift control region 31 or the optional semiconductor region 33, respectively. For electrically connecting the drift control region 31 or the optional semiconductor region 33 to the contact electrode 34, the drift control region 31 or the optional semiconductor region 33, respectively, may include a more highly doped contact region (not illustrated) of the same the doping type as the drift control region 31 or the optional semiconductor region 33, respectively. This contact region is contacted by the contact electrode 34.

The doping concentration of the drift control region 31 may correspond to the doping concentration of the drift region 11.

The doping type of the drift control region 31 may correspond to the doping type of the drift region 11, or may be complementary to the doping type of the drift region 11. According to one embodiment, the drift control region 31 and the drift region 11 are intrinsic.

The basic operating principle of the semiconductor device arrangement of FIGS. 1 to 3 is now explained. For explanation purposes it is assumed that the MOSFET is an n-type enhancement MOSFET with an n-doped drift zone 11, and that the drift control region 31 has the same doping type as the drift region 11. In this case, the biasing source 40 is configured to bias the drift control region 31 to have a positive potential relative to the electrical potential of the source terminal S (source potential), when the MOSFET is in the on-state. The MOSFET is in the on-state, when the drive potential applied to the gate terminal G generates a conducting channel in the body region 12 between the source region 13 and the drift region 11, and when a positive voltage is applied between the drain and source terminals D, S. In the on-state, the drift control region 31, which has a higher electrical potential than the drift region 11, generates an accumulation channel in the drift region 11 along the drift control region dielectric 21. This accumulation channel significantly reduces the on-resistance of the MOSFET as compared to a MOSFET without a drift control region. When the drift region 11 is doped complementarily to the source and drain regions 13, 15, the drift control region 31 generates an inversion channel in the drift region 11 along the drift control region dielectric 21.

The MOSFET is in the off-state, when the channel along the gate dielectric 18 in the body region 12 is interrupted. In this case, a depletion region expands in the drift region 11 beginning at a pn-junction between the body region 12 and the drift region 11. The depletion region expanding in the drift region 11 causes a depletion region also to expand in the drift control region 31, which, like the drift region 11, may include a monocrystalline semiconductor material. By virtue of a depletion region expanding in the drift region 11 and a depletion region expanding in the drift control region 31, a voltage across the drift control region dielectric 21 is limited.

In the off-state of the MOSFET, the capacitive storage element 42 serves to store electrical charges that are required in the drift control region 31 when the MOSFET is in its on-state. These charges are positive charges in an n-type MOSFET and can be provided by the semiconductor zone 33. The capacitive storage element 42 may be integrated partially or completely in the drift control region 31 or the optional semiconductor region 33.

The rectifier element 44 allows charge carriers that are thermally generated in the drift control region 31 to flow to the drain region 15, in order to prevent an electrical potential of the drift control region 31 to increase in an uncontrolled manner. The rectifier element 44 therefore operates as a voltage limiting element that limits a voltage difference between the electrical potential of the drift control region 31 and the drain electrode 16. This rectifier element 44 is connected up such that in the on-state of the MOSFET the drift control region 31 may assume a higher electrical potential than the potential at the drain terminal D.

The MOSFET can be implemented with a cell-like structure and may include a plurality of transistor cells connected in parallel. Each transistor cell includes a source region 13, a body region 12, a drift region 11, a drain region 15, a gate electrode 17, a gate dielectric 18, a drift control region dielectric 21 and a drift control region 31, where each of these device regions may be shared by two or more transistor cells. In FIGS. 1 to 3, two transistor cells are illustrated in solid lines, with these two transistor cells having one gate electrode 17 and one drift region 11 in common. Further transistor cells are illustrated in dotted lines in these figures. The individual transistor cells are connected in parallel by having their source regions 13 connected to a common source terminal S, by having their drain regions 15 connected to a common drain terminal D, and by having their gate electrodes 17 connected to a common gate terminal G.

In the example illustrated in FIGS. 1 to 3 the gate electrode 17 is a trench electrode that is arranged in a trench of the semiconductor body 100, with the trench extending from the first surface 101 in a vertical direction of the semiconductor body 100. However, this is only an example. The gate electrode 17 could also be implemented as a planar electrode above the first surface 101 of the semiconductor body 100.

Figure 4:
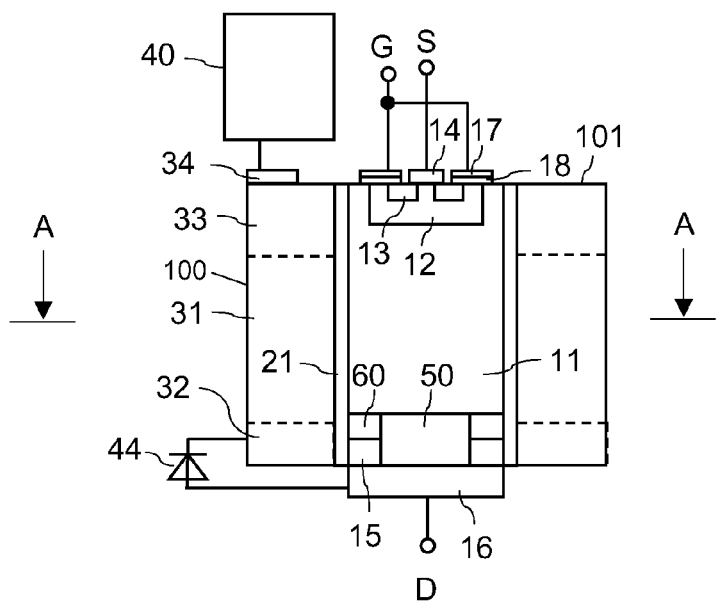
FIG. 4 illustrates a vertical cross sectional view of a semiconductor device including a planar gate electrode.

An embodiment of a MOSFET implemented with a planar gate electrode 17 is illustrated in FIG. 4. While in a MOSFET with a trench electrode, such as the MOSFETs illustrated in FIGS. 1 to 3, the gate electrode 17 and the gate dielectric 18 extend in a vertical direction of the semiconductor body 100, so that in the on-state the conducting channel in the body region 12 also extends in the vertical direction, the gate electrode 17 and the gate dielectric 18 extend in a horizontal direction of the semiconductor body 100 when the gate electrode 17 is implemented as a planar electrode, such as illustrated in FIG. 4. In this case, a section of the drift region 11 extends to the first surface 101 of the semiconductor body 100.

Figure 5:
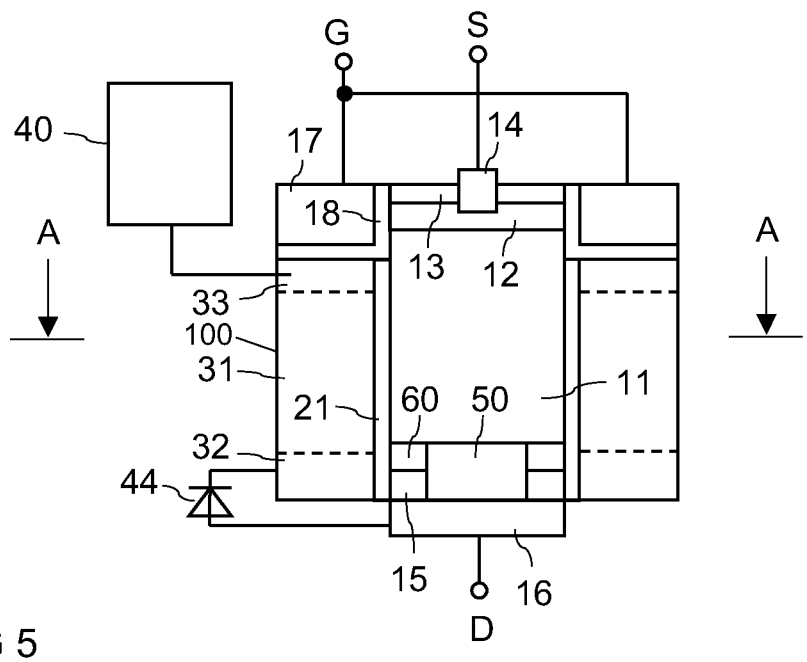
FIG. 5 illustrates a vertical cross sectional view of a semiconductor device including a trench gate electrode according to a further embodiment.

FIG. 5 illustrates a vertical cross sectional view of a MOSFET with another gate electrode structure. In this embodiment, the gate electrode 17 is implemented as a trench electrode above the drift control region 31.

Figure 6:
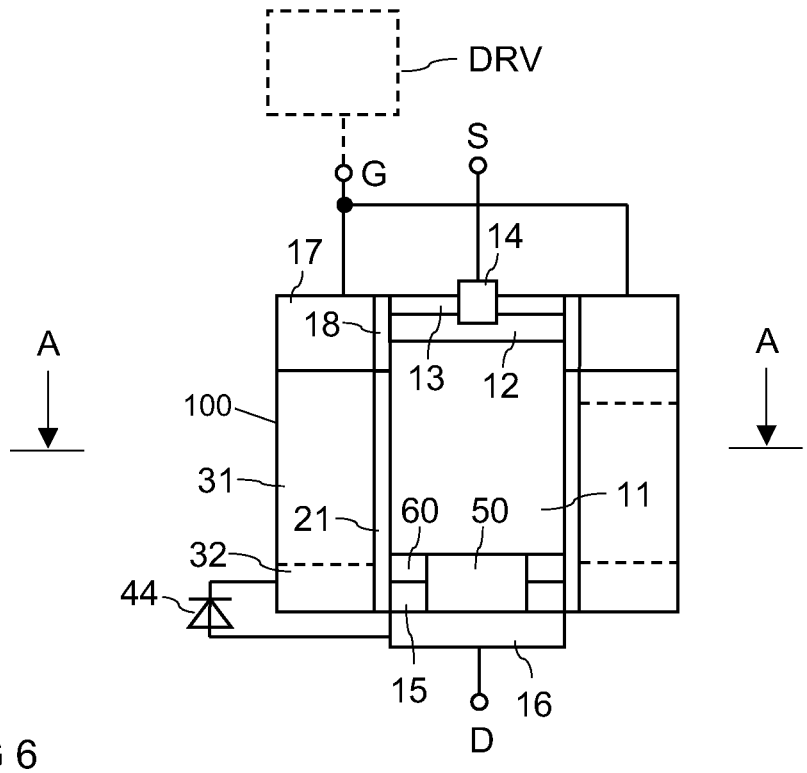
FIG. 6 illustrates a vertical cross sectional view of a semiconductor device including a trench gate electrode according to a further embodiment.

FIG. 6 illustrates a vertical cross sectional view of a MOSFET according to a further embodiment. In this embodiment, the drift control region 31 or the optional semiconductor region 33 adjoins the gate electrode 17. In this embodiment, the gate electrode 17 includes a monocrystalline semiconductor material. According to one embodiment, the doping type and the doping concentration of the gate electrode 17 corresponds to the doping type and the doping concentration of the drift control region 31. In this embodiment, the gate electrode 17 and the drift control region 31 are formed by a contiguous monocrystalline semiconductor region of the same doping type and doping concentration. In this case, the gate electrode 17 is the semiconductor region adjacent the body region 12 and the drift control region 31 is the semiconductor region adjacent the drift region 11.

According to a further embodiment, the gate electrode 17 has the same doping type as the body region 12, which can be complementary to the doping type of the drift control region 31. The doping concentration of the gate electrode 17 may correspond to the doping concentration of the body region 12. In other words, the doping concentration of the gate electrode 17 may correspond to the doping concentration of the optional semiconductor region 33 explained before. This semiconductor region 33 can be omitted in this case.

The gate electrode 17 serves to control a conducting channel in the body region 12 and is dielectrically insulated from the body region 12 by the gate dielectric 18. The operating principle of the semiconductor device of FIG. 6 corresponds to the operating principle of the semiconductor devices of FIGS. 1 to 5 with the difference being that in the semiconductor device of FIG. 6 the drift control region 31 is charged through the gate electrode 17 when the device is switched on and is discharged through the gate electrode 17. The required electrical charge is provided by the gate drive circuit. The drift control region dielectric 21 and the gate dielectric 18 that adjoin one another can be formed by one dielectric layer, which is a vertical dielectric layer in the embodiment of FIG. 6.

Figure 7:
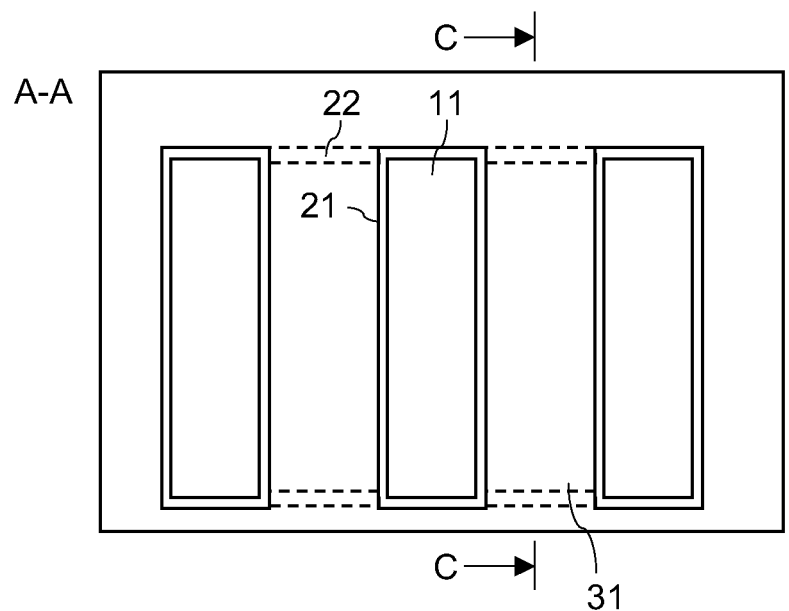
FIG. 7 illustrates a horizontal cross sectional view of a semiconductor device including device cells with longitudinal drift regions.
Figure 8:
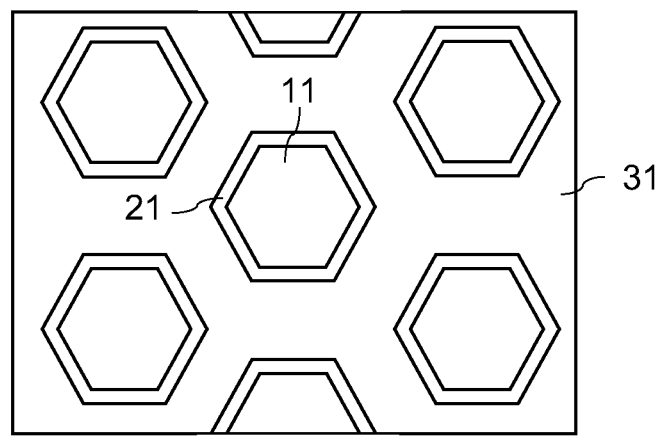
FIG. 8 illustrates a horizontal cross sectional view of a semiconductor device including device cells with hexagonal drift regions.

In the horizontal plane, which is a plane parallel to the first surface 101 of the semiconductor body 100, the individual transistor cells can be implemented in many different ways. Two possible implementations are illustrated in FIGS. 7 and 8. FIGS. 7 and 8 show horizontal cross sectional views of the semiconductor body 100 in a section plane A-A cutting through the drift region 11, the drift control region dielectric 21 and the drift control region 31 of the MOSFETs according to FIGS. 1 to 6.

Referring to FIG. 7, the drift regions 11 of the individual transistor cells may have a longitudinal (stripe) shape in the horizontal plane. One drift control region 31 may surround the individual drift regions 11. According to a further embodiment (illustrated in dashed lines in FIG. 7) there is a plurality of drift control regions 31 having a longitudinal shape, with each drift control region 31 being terminated by further dielectric layers 22 at the longitudinal ends.

Referring to FIG. 8, the drift regions 11 of the individual transistor cells may have a hexagonal shape. However, the drift regions 11 could also be implemented with other shapes, such as elliptical, rectangular, octagonal, or other polygonal shapes as well.

Figure 9:
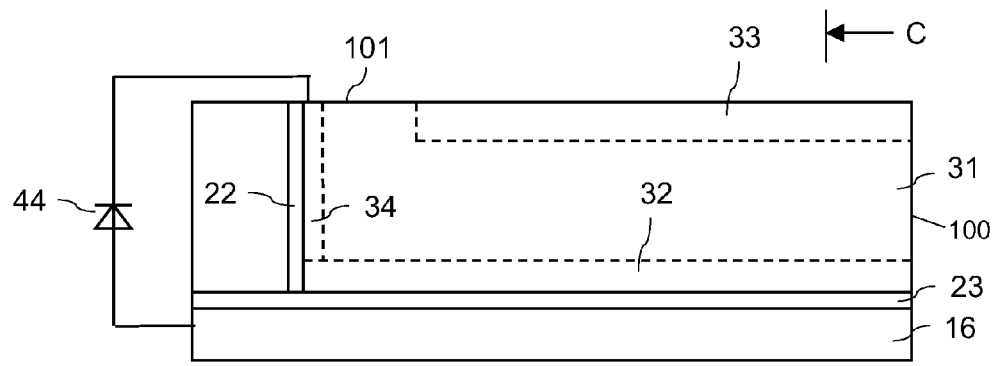
FIG. 9 illustrates a vertical cross sectional view of a longitudinal drift region according to a first embodiment.

Referring to FIG. 9, in a MOSFET with longitudinal drift regions 11, the rectifier element 44 can be connected to the drift control region 31 via the first surface 101. FIG. 9 illustrates a vertical cross sectional view of one drift control region 31 in a vertical section plane C-C illustrated in FIG. 1. In this embodiment, the drain electrode 16 is also arranged below the drift control region 31 but is dielectrically insulated from the drift control region 31 by a further dielectric layer 23. Thus, the drift control region 31 is arranged in a "dielectric well" that includes the drift control region dielectric 21 (not illustrated in FIG. 9), the dielectric 22 at the longitudinal ends (where in FIG. 9 only one longitudinal end is illustrated) and the further dielectric layer 23 at the bottom of the drift control region dielectric 21. The rectifier element 44 is connected between the drain electrode 16 and a further connection zone 34. The further connection zone 34 has the same doping type as the connection zone 23 and extends from the first surface 101 along the dielectric layer 22 at the longitudinal end to the connection zone 23, so as to connect the rectifier element to the connection zone 23 at the drain-sided end of the MOSFET. The optional semiconductor region 33 is distant to the vertical connection region 34.

Figure 10:
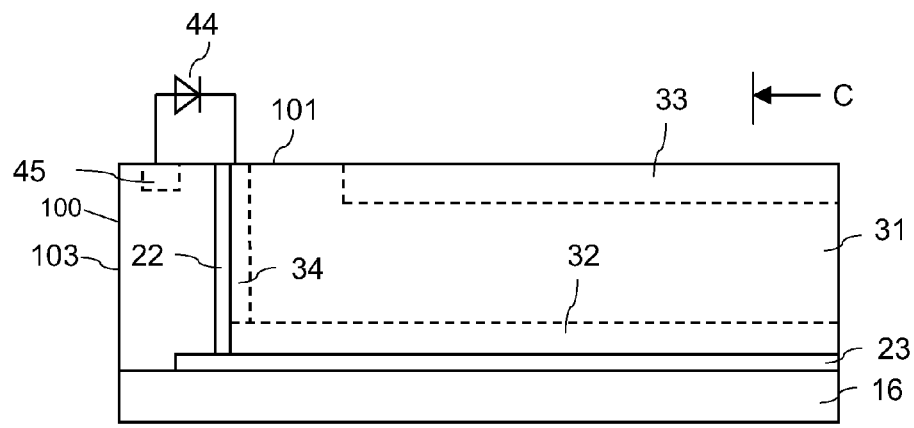
FIG. 10 illustrates a vertical cross sectional view of a longitudinal drift region according to a second embodiment.

According to a further embodiment illustrated in FIG. 10, the rectifier element 44 is connected between a contact region 45 at the first surface 101 and the vertical connection region 34. The contact region 45 is located in an edge region of the semiconductor body 100. The edge region of the semiconductor body 100 is a region adjoining a vertical edge 103 of the semiconductor body 100. The vertical edge 103 terminates the semiconductor body 100 in a horizontal direction. In this embodiment, the further dielectric layer 23 does not extend to the vertical edge, so that the drain electrode 16 is in contact with the edge region in which the contact region 45 is located.

Referring to the explanation provided before, a conducting channel is generated in the drift region 11 along the drift control region dielectric 21 when the MOSFET is in the on-state. For this, the drift control region 31 is biased such that the electrical potential of the drift control region 31 is above the electrical potential of the drift region 11 in an n-type MOSFET and is below the electrical potential of the drift region 11 in a p-type MOSFET. The voltage difference between the electrical potentials of the drift control region 31 and the drift region 11 required to generate the conducting channel along the drift control region dielectric 21 is dependent on the thickness of the drift control region dielectric 21. This thickness, for example, is in the range of between 10 nm and 200 nm. Depending on the length of the drift region 11 and the load current, the voltage drop across the drift region 11 in the on-state of the semiconductor device is, for example, in the range of between 0.1V and 3V. The "length" of the drift region 11 is the dimension of the drift region 11 in the current flow direction.

When the semiconductor device is in the off-state, the voltage that is applied between the drain and source terminals D, S mainly drops across the drift region 11. Dependent on the voltage blocking capability of the semiconductor device, this voltage drop can be up to several 100V. When the semiconductor device switches from the off-state to the on-state, the depletion region has to be removed from the drift region 11, so that the electrical potential of the drift region 11 decreases. When the depletion region is removed from the drift region 11, the electrical potential of the drift region 11 first decreases in a region close to the pn-junction between the body region 12 and the drift region 11 and subsequently also decreases in regions closer to the drain-sided end of the drift region 11. Thus, a conducting channel along the drift region control dielectric 21 is first formed in regions close to the body region 12 when the drift control region 31 is biased. When a current flows through the drift region 11 before a conducting channel has been formed along the complete length of the drift control region dielectric 21 to the drain region 15, a high voltage drop may occur in those regions of the drift region 11 in which there is no conducting channel along the drift control region dielectric 21. This voltage drop may have the effect that the voltage difference between the electrical potential of the drift control region 31 and the electrical potential of the drift region 11 is not high enough in order to generate the conducting channel along the drift control region dielectric 21, so that the semiconductor device cannot be switched on completely, which means the device cannot reach its minimum on-resistance. The on-resistance of the semiconductor device is the electrical resistance between the source and drain regions 13, 15, when the device is in the on-state. This problem may also occur when there is a high current flowing through the device so that there is a high voltage drop across the drift region 11. Even at low load currents, this effect results in a slow decrease of the on-resistance after switching on and, therefore, causes increased switching losses.

In order to accelerate the transition of the semiconductor device from the off-state into the on-state, specifically in order to reduce the electrical potential in a drain-sided region of the drift region 11 when the semiconductor device has switched on, the semiconductor device includes an injection region 50 and an injection control region 60. The injection region 50 and the injection control region 60 can be implemented in many different ways as will be explained below.

Figure 11A:
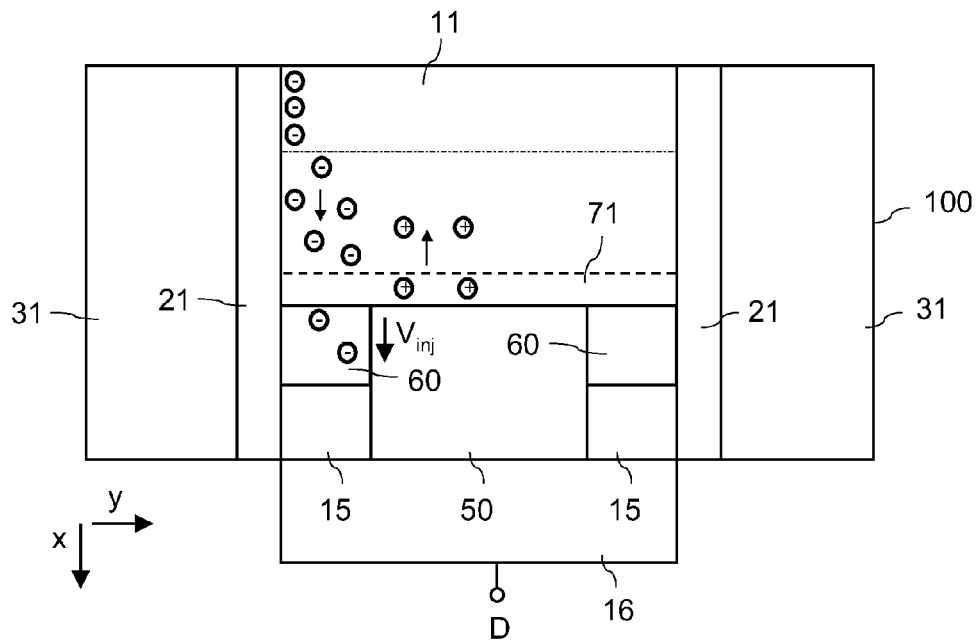
FIGS. 11A and 11B illustrates the operating principle of the injection region and the injection control region.
Figure 11B:
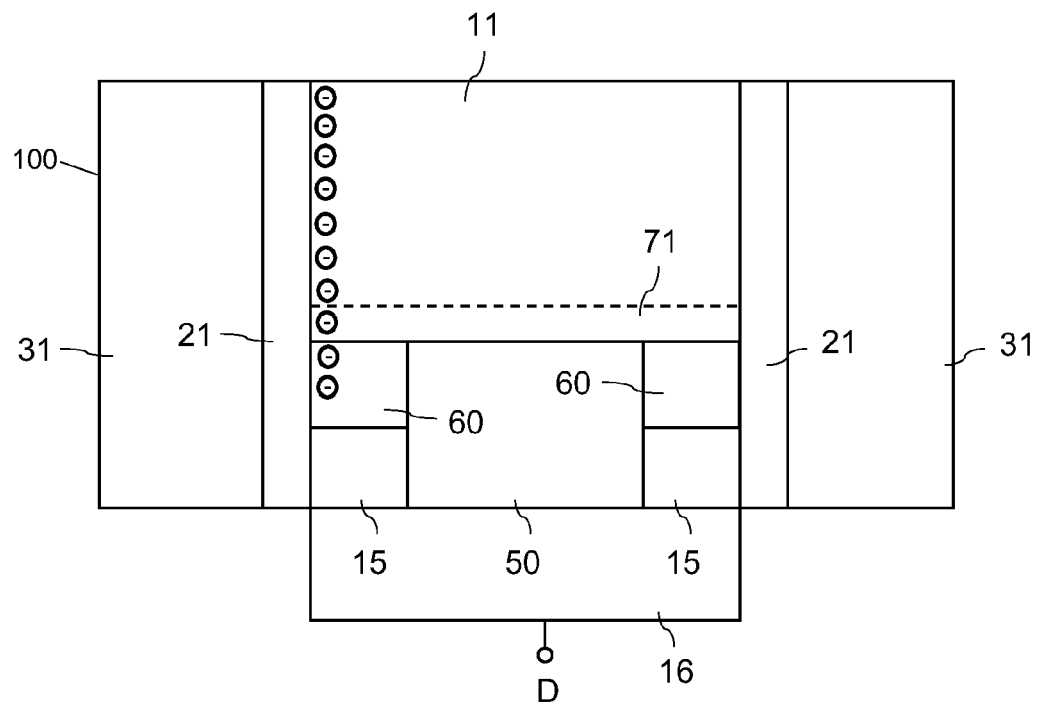

A first embodiment of the injection region and the injection control region is illustrated in FIG. 1 and is also illustrated in more detail in FIGS. 11A and 11B. FIGS. 11A and 11B also show a vertical cross section view of the semiconductor device of FIG. 1, where in FIGS. 11A and 11B only the device structure at a drain-sided end of the semiconductor device is illustrated in detail.

The injection region 50 is arranged between the drift region 11 and the drain electrode 16. According to one embodiment, the injection region 50 adjoins the drain electrode 16. In this case, the injection region 50 is electrically connected to the drain electrode 16 when the drain electrode 16 includes an electrically conductive material, such as a metal, a silicide or a highly doped polycrystalline material, such as polysilicon, or the injection region 50 is connected to the drain electrode 16 via a pn junction when the drain electrode 16 is a highly doped monocrystalline semiconductor substrate with a doping concentration higher than the doping concentration of the injection region 50.

According to a further embodiment, the injection region 50 does not adjoin the drain electrode 16 but is coupled to the drain electrode 16 via the drain region 15 or another highly doped n-type semiconductor region. According to one embodiment, this n-type semiconductor region between the drain electrode 16 and the injection region 50 is a diffusion region and the drain electrode 16 includes a highly doped polycrystalline material. In this case, the n-type semiconductor region coupling the injection region 50 to the drain electrode 16 can be a semiconductor region resulting from the diffusion of dopant atoms from the drain electrode 16 into the injection region 50.

The injection region 50 has a doping type that is complementary to the doping type of the source and drain regions 13, 15, so that in an n-type MOSFET the injection region 50 is p-doped, while in a p-type MOSFET, the injection region 50 is n-doped. Just for illustration and explanation purposes it is assumed that the MOSFET is an n-type MOSFET with a p-type injection region 50. The doping concentration of the injection region 50 is, for example, between 1E14 cm$^{-3}$ and 1E21 cm$^{-3}$. The injection control region 60 adjoins the drift control region dielectric 21 and extends in a first direction x along the drift control region dielectric 21. In the embodiment illustrated in FIGS. 1 and 11A and 11B, the first direction x corresponds to the vertical direction of the semiconductor body 100. The injection control region 60 adjoins the drain region 15 in the first direction x and adjoins the injection region 50 in a second direction y that is different from the first direction x. In the embodiment illustrated in FIGS. 11A and 11B, the injection control region 60 is arranged between the drift control region dielectric 21 and the injection region 50 in the second direction y. In this embodiment, the second direction y is perpendicular to the first direction x and corresponds to a first horizontal direction of the semiconductor body 100 or the drift region, respectively. This first horizontal direction is perpendicular to the drift control region dielectric 21 or to an interface between the drift control region dielectric 21 and the drift region 11, respectively. According to one embodiment, the drain region 15 also adjoins the drift control region dielectric 21.

The operating principle of the injection region 50 and the injection control region 60 is now explained with reference to FIGS. 11A and 11B. Referring to FIG. 11A, for explanation purposes it is assumed that the semiconductor device has been switched on so that charge carriers flow from the source region 13 through the body region 12 (both out of view in FIGS. 11A and 11B) and the drift region 11 and the injection control region 60 to the drain region 15. However, at a drain-sided end of the drift region 11 a voltage difference between the drift control region 31 and the drift region 11 is below a threshold voltage that is necessary to generate a conducting channel along the drift control region dielectric 21 in this region of the drift region 11. In FIG. 11A the flow of charge carriers (electrons in this embodiment) through the drift region 11 to the drain region 15 is schematically illustrated. The dashed and dotted line in FIG. 11A schematically illustrates a border in the drift region 11. Above this border, which means between the body region 12 (not illustrated in FIG. 11A) and this border, a conducting channel is present along the drift control region dielectric 21, so that the charge carriers flow along the drift control region dielectric 21 in this conducting channel. This conducting channel has a much lower electrical resistance than the drift region 11, so that almost no charge carriers flow in the drift region 11 distant to the drift control region dielectric 21 in this area above the border. Below this border, which means at a drain-sided end of the drift region 11 where there is no conducting channel along the drift control region dielectric 21, the charge carriers flow through the drift region 11 distant to the drift control region dielectric 21 and also flow through the injection control region 60 distant to the drift control region dielectric 21. The doping concentration of the injection control region 60 is such that charge carriers flowing through the injection control region 60 cause a voltage drop $V_{inj}$ along the injection control region 60. According to one embodiment, the doping concentration of the injection control region 60 is between 1E12 cm$^{-3}$ and 5E15 cm$^{-3}$. When this voltage drop $V_{inj}$ is above a threshold voltage, which is about 0.6V when the semiconductor material of the semiconductor body 100 is silicon, the adjacent injection region 50 starts to inject charge carriers into the drift region 11. These charge carriers, which are p-type charge carriers in an n-type MOSFET help to reduce the electrical potential at the drain-sided end of the drift region 11 so that a conducting channel along the complete length of the drift control region dielectric 21 can be generated. When there is a conducting channel along the drift control region dielectric 21 the charge carriers flow along the drift control region dielectric 21 through the drain-sided end of the drift region 11 and the injection control region 60 to the drain region 15, so that the injection control region 60 is "bypassed". Charge carriers flowing in the conducting channel through the injection control region 60 cause a lower voltage drop in the injection control region 60 than charge carriers flowing through "the volume" of the injection control region 60. The length and the doping concentration of the injection control region 60 are adjusted such that charge carriers flowing through the conducting channel cause a voltage drop in the injection control regions 60 that is lower than the threshold voltage, so that the injection region 50 stops to inject charge carriers into the drift region 11 after the semiconductor device has been switched on completely. If the injection region 50 would proceed to inject charge carriers into the drift region 11 until the semiconductor device is again switched off, these charge carriers would have to be removed from the drift region 11 in order to switch off the semiconductor device. This removal takes time, which would increase the transition time from the on-state to the off-state and would increase switching losses. Further, removing these charge carriers when the voltage across the drift region 11 has already increased (due to switching off the device) causes losses.

Optionally, the semiconductor device includes a field-stop region 71 arranged between the drift region 11 and the injection control region 60 and the injection region 50. The doping concentration of the field-stop region 71 is higher than the doping concentration of the drift region 11. The doping concentration of the field-stop region 71 is, for example, between 1E14 cm$^{-3}$ and 1E17 cm$^{-3}$. Different from what is illustrated in FIGS. 11A and 11B, the field stop layer 71 may extend into the injection control region 60, next to the injection region 50.

Figure 12:
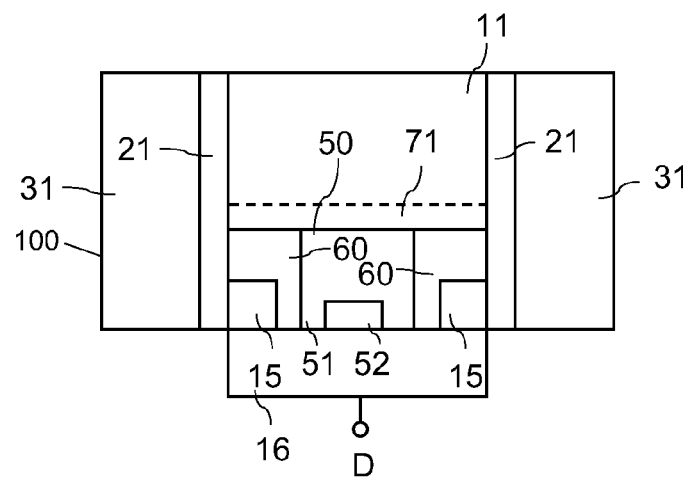
FIG. 12 illustrates a modification of the injection region and the injection control region illustrated in FIG. 1.

FIG. 12 schematically illustrates a further embodiment of the injection region 50 and the injection control region 60. In this embodiment, the injection region 50 has two differently doped sections, namely a higher doped contact section 52 adjoining the drain electrode 16 and a lower doped section 51 that adjoins the injection control region 60. The doping concentration of the higher doped contact section 52 is, for example, between $1E18\ cm^{-3}$ and $1E21\ cm^{-3}$. Further, the injection control region 60 is arranged between the drain region 15 and the injection region 50 in this embodiment.

Figure 13A:
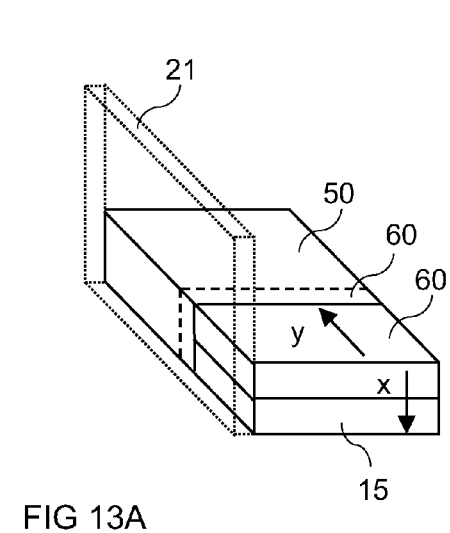
FIGS. 13A to 13D illustrates an injection region and an injection control region according to a second embodiment.
Figure 13B:
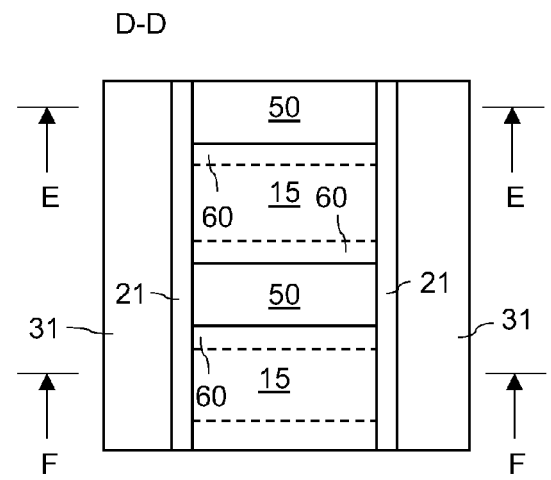
Figures 13C, 13D:
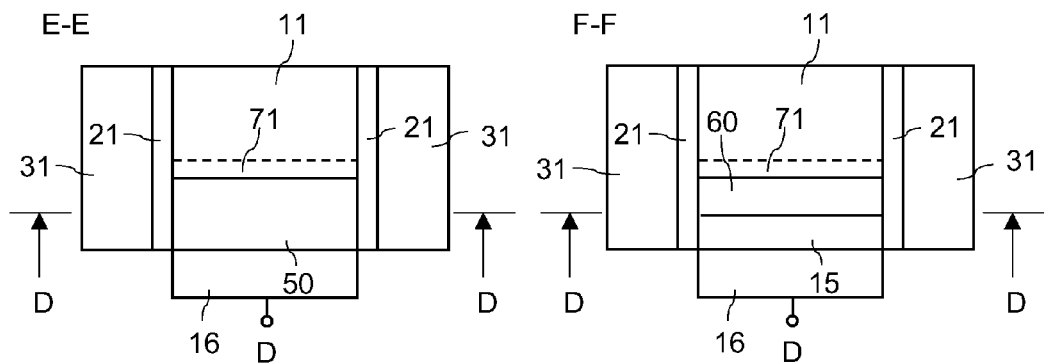

FIGS. 13A to 13D illustrate a further embodiment of the injection region 50 and the injection control region 60. FIG. 13A illustrates a perspective sectional view of the injection region 50 and the injection control region 60. FIG. 13B illustrates a horizontal cross sectional view in a section plane D-D extending through the drain region 15 and the injection region 50, in FIGS. 13C and 13D show vertical cross sectional views in two different section planes E-E and F-F, extending through the drain region 15 and the injection region 50, respectively.

In the embodiment illustrated in FIGS. 13A to 13D, the first direction x, in which the injection control region 60 extends along the drift control region dielectric 21 is again the vertical direction x of the semiconductor body 100, with this vertical direction corresponding to a main current flow direction of the semiconductor device. The second direction y in which the injection control region 60 adjoins the injection region 50 corresponds is again perpendicular to the first direction x and corresponds to a second horizontal direction of the semiconductor body 100. This second horizontal direction y is parallel to the drift control region dielectric 21 or to the interface between the drift control region dielectric 21 and the drift region 11, respectively. Further, when the drift region 11 is implemented as a longitudinal (stripe shaped) drift region, the second direction y corresponds to the longitudinal direction of the drift region 11. The injection region 50 and the injection control region 60 each extend along the width of the drift region 11 between two drift control region dielectrics 21. The width of the drift region 11 is the dimension of the drift region 11 between two neighboring drift control region dielectrics 21. The drain region 15 may also extend along the width of the drift region 11 between two drift control region dielectrics 21. However, it is also possible to implement the drain region 15 such that it is only arranged adjacent the drift control region dielectric 21 but does not completely extend between two drift control region dielectrics 21.

Referring to FIG. 13D, the injection control region 60 is again arranged between the drift region 11 and the drain region 15 in the first direction x, so that the injection control region 60 adjoins the drain region 15 in this first direction x.

In FIGS. 13A and 13B, the dashed lines illustrate an embodiment, in which sections of the injection control region 60 are arranged between the injection region 50 and the drain region 15. This is similar to the embodiment illustrated in FIG. 12. Referring to FIGS. 13A and 13B, a plurality of drain regions 15 and injection regions 50 can be arranged alternately in the longitudinal direction of the drift region 11.

Figure 14A:
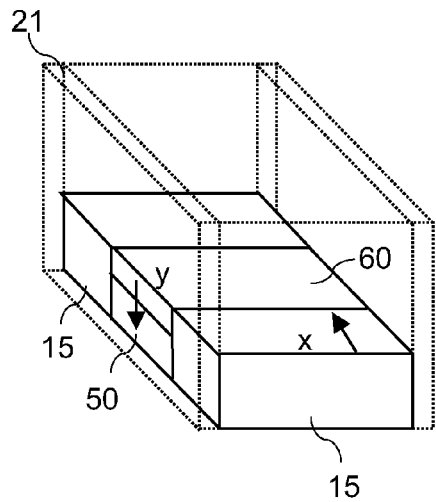
FIGS. 14A to 14C illustrates an injection region and an injection control region according to a third embodiment.
Figure 14B:
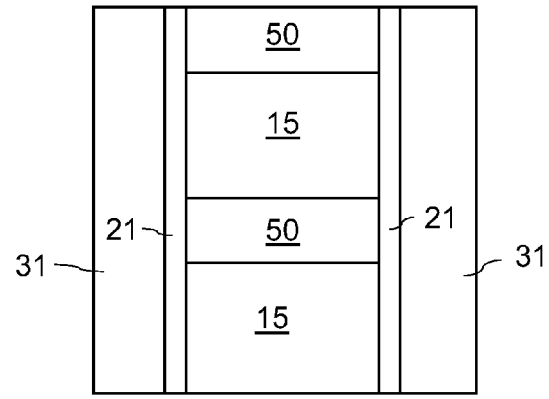
Figure 14C:
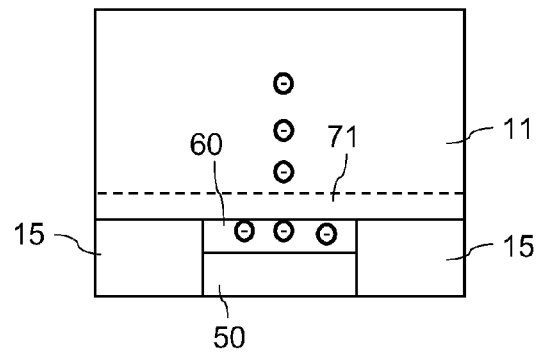

FIGS. 14A to 14C illustrate a further embodiment of the injection region 50 and the injection control region 60. FIG. 14A illustrates a perspective sectional view of the injection region 50 and the injection control region 60, FIG. 14B illustrates a horizontal cross sectional view of the injection region 50 and the drain region 15, and FIG. 14C shows a vertical cross sectional view of the injection region 50 and the injection control region 60.

In this embodiment, the first direction x of the injection control region 60 corresponds to the second horizontal direction (the longitudinal direction of the drift region 11) and the second direction y corresponds to the vertical direction of the semiconductor body 100. Referring to FIG. 14C, charge carriers from the drift region 11 first flow in a vertical direction into the injection control region 60 and in the injection control region 60 then flow in the longitudinal direction (that corresponds to the first direction x) into the drain region 15 and cause a voltage drop in the injection control region 60. This voltage drop causes charge carriers (p-type charge carriers in this embodiment) to be injected into the drift region 11. The majority of charge carriers are injected in the middle of the injection region 50. The "middle" of the injection region 50 is the middle in the first direction x between two sections of the drain region 15. These charge carriers are injected into the drift region 11 through the injection control region 60 and the optional field stop layer 71. According to one embodiment, the dimension of the injection region 50 in the first direction x is 2 μm or more.

Figure 15A:
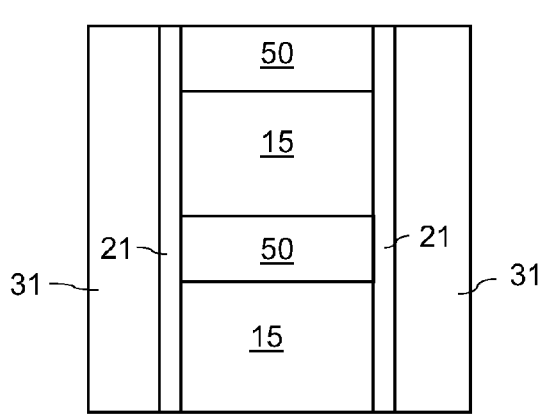
FIGS. 15A and 15B illustrates an injection region and an injection control region according to a fourth embodiment.
Figure 15B:
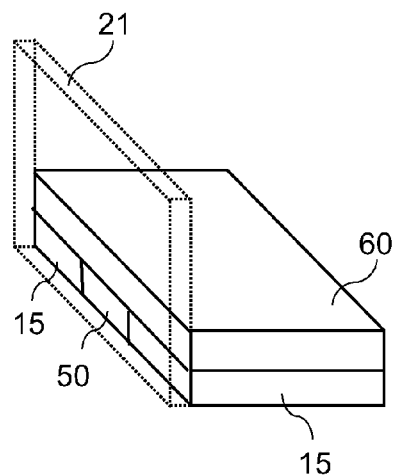

FIGS. 15A and 15B illustrate a further embodiment of the injection region 50 and the injection control region 60. FIG. 15A illustrates a perspective sectional view of these device regions 50, 60 and the drain region 15, and FIG. 15B shows a horizontal cross sectional view of the drain region 15 and the injection region 50. In this embodiment, the first direction x, in which the drain region 15 adjoins the injection control region 60, and the second direction y, in which the injection region 50 adjoins the injection control region 60 are not different, but are equal and correspond to the vertical direction of the drift region 11. The direction in which the injection region 50 is adjacent the drain region 15 corresponds to the second horizontal direction. The mechanism of injecting charge carriers from the injection region 50 into the drift region 11 is the same as explained with reference to FIGS. 14A to 14C.

Figure 16A:
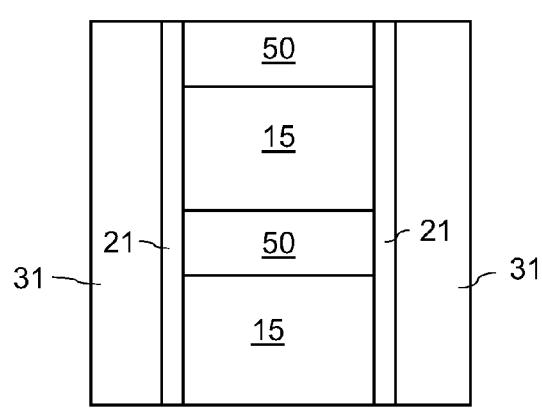
FIGS. 16A and 16B illustrates an injection region and an injection control region according to a fifth embodiment.
Figure 16B:
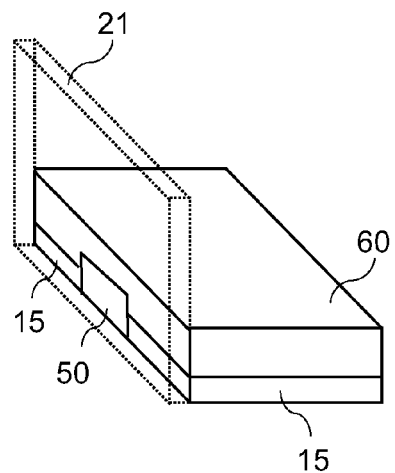

FIGS. 16A and 16B illustrate a further embodiment of the injection region 50 and the injection control region 60. This embodiment is a combination of the embodiments illustrated in FIGS. 13A to 13D and 14A to 14C. In this embodiment, the injection control region 60 is arranged above the drain region 15 and the injection region 50, wherein a vertical dimension of the drain region 15 is lower than the vertical dimension of the injection region 50. In this embodiment, there is a horizontal interface between the injection region 50 and the injection control region 60 as well as a vertical interface. Charge carriers flowing in the injection control region 60 may cause a voltage along the horizontal interface as well as along the vertical interface. These voltage drops add, so that the injection region 50 starts to inject when the overall voltage drop is sufficiently high (more than 0.6V in silicon).

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:
1. A semiconductor device arrangement comprising a semiconductor device, the semiconductor device comprising:

a source region, a drain region, a body region, and a drift region, the drift region arranged between the body region and the drain region and the body region arranged between the source region and the drift region in a semiconductor body;

a gate electrode adjacent the body region and dielectrically insulated from the body region by a gate dielectric;

a drift control region adjacent the drift region and dielectrically insulated from the drift region by a drift control region dielectric;

an injection region of a doping type complementary to the doping type of the drain region, the entire injection region being arranged on an opposite side of the drift control region dielectric as the drift control region;

a drain electrode adjoining the drain region; and an injection control region of the same doping type as the drain region but more lowly doped, wherein the injection control region adjoins the drift control region dielectric, extends in a first direction along the drift control region, and adjoins the drain region in the first direction and the injection region in a second direction different from the first direction.

2. The semiconductor device arrangement of claim 1, wherein the injection region adjoins the drain electrode.

3. The semiconductor device arrangement of claim 1, wherein the drain electrode includes one of an electrically conductive material and a semiconductor substrate.

4. The semiconductor device arrangement of claim 1, wherein the second direction is perpendicular to the first direction.

5. The semiconductor device arrangement of claim 1, wherein the drain region adjoins the drift control region dielectric.

6. The semiconductor device arrangement of claim 1, wherein the first direction corresponds to a current flow direction of the semiconductor device in the drift region.

7. The semiconductor device arrangement of claim 1, wherein the first direction corresponds to a direction perpendicular to a current flow direction of the semiconductor device in the drift region.

8. The semiconductor device arrangement of claim 1, further comprising a field stop layer of the same doping type as the drain region and more highly doped than the drift region arranged between the drift region and the injection region and the injection control region, respectively.

9. The semiconductor device arrangement of claim 1, wherein the semiconductor device is implemented as a vertical semiconductor device, wherein the drift region has a vertical direction, a first horizontal direction and a second horizontal direction different from the first horizontal direction, the first and second horizontal direction being perpendicular to the vertical direction.

10. The semiconductor device arrangement of claim 9, wherein the first direction corresponds to the vertical direction.

11. The semiconductor device arrangement of claim 10, wherein the second direction corresponds to the first horizontal direction of the drift region.

12. The semiconductor device arrangement of claim 11, wherein the first horizontal direction is perpendicular to an interface between the drift control region dielectric and the drift region.

13. The semiconductor device arrangement of claim 10, wherein the second direction corresponds to the second horizontal direction of the drift region.

14. The semiconductor device arrangement of claim 13, wherein the second horizontal direction is parallel to an interface between the drift control region dielectric and the drift region.

15. The semiconductor device arrangement of claim 9, wherein the first direction corresponds to the first horizontal direction and the second direction corresponds to the vertical direction, the first horizontal direction being parallel to an interface between the drift control region dielectric and the drift region.

16. The semiconductor device arrangement of claim 1, wherein a doping concentration of the injection control region corresponds to the doping concentration of the drift region.

17. The semiconductor device arrangement of claim 1, wherein a doping concentration of the injection control region is different from to the doping concentration of the drift region.

18. The semiconductor device arrangement of claim 17, wherein the doping concentration of the injection control region is higher than the doping concentration of the drift region.

19. The semiconductor device arrangement of claim 1, further comprising a biasing source coupled to the drift control region.

20. The semiconductor device arrangement of claim 1, wherein the gate electrode adjoins the drift control region or adjoins a semiconductor region of a doping type complementary to the doping type of the source region, the semiconductor region adjoining the drift control region.

21. A semiconductor device arrangement comprising a semiconductor device, the semiconductor device comprising:

a source region, a drain region, a body region, and a drift region, the drift region arranged between the body region and the drain region and the body region arranged between the source region and the drift region in a semiconductor body;

a gate electrode adjacent the body region and dielectrically insulated from the body region by a gate dielectric;

a drift control region adjacent the drift region and dielectrically insulated from the drift region by a drift control region dielectric;

an injection region of a doping type complementary to the doping type of the drain region, the entire injection region being arranged on an opposite side of the drift control region dielectric as the drift control region;

a drain electrode electrically contacting the drain region; and an injection control region of the same doping type as the drain region but more lowly doped, wherein the injection control region adjoins the drift control region dielectric, extends in a first direction along the drift control region, adjoins the drain region and the injection region and has a doping concentration different from the doping concentration of the drift region, wherein the injection control region adjoins the drain region in the first direction and adjoins the injection region in a second direction different from the first direction.

22. The semiconductor device of claim 21, wherein the first direction corresponds to a current flow direction of the semiconductor device in the drift region.

* * * * *